(12) United States Patent
Kajihara et al.

(10) Patent No.: US 9,559,281 B2
(45) Date of Patent: Jan. 31, 2017

(54) THERMOELECTRIC POWER MODULE

(75) Inventors: Takeshi Kajihara, Hiratsuka (JP);
Kouichi Ishida, Hiratsuka (JP);
Shinichi Fujimoto, Hiratsuka (JP);
Hiroyuki Mizukami, Hiratsuka (JP)

(73) Assignee: KOMATSU LTD., Tokyo (JP)

( * ) Notice: Subject to any disclaimer, the term of this patent is extended or adjusted under 35 U.S.C. 154(b) by 126 days.

(21) Appl. No.: 13/579,382

(22) PCT Filed: Feb. 14, 2011

(86) PCT No.: PCT/JP2011/053596
§ 371 (c)(1),
(2), (4) Date: Sep. 13, 2012

(87) PCT Pub. No.: WO2011/102498
PCT Pub. Date: Aug. 25, 2011

(65) Prior Publication Data
US 2013/0032188 A1  Feb. 7, 2013

(30) Foreign Application Priority Data

Feb. 22, 2010 (JP) .................................. 2010-036474

(51) Int. Cl.
*H01L 35/30* (2006.01)
*H01L 35/28* (2006.01)
(Continued)

(52) U.S. Cl.
CPC .............. *H01L 35/28* (2013.01); *H01L 35/08* (2013.01); *H01L 35/00* (2013.01); *H01L 35/32* (2013.01)

(58) Field of Classification Search
CPC .......... H01L 35/04; H01L 35/08; H01L 35/00; H01L 35/28; H01L 35/32
(Continued)

(56) References Cited

U.S. PATENT DOCUMENTS 4,853,296 A    8/1989  Fukuyoshi

FOREIGN PATENT DOCUMENTS

CN    101447548      6/2009
GB       1033018   *  6/1966
(Continued)

OTHER PUBLICATIONS

English machine translation of JP2009-231317.*
(Continued)

*Primary Examiner* — Lindsey Bernier
(74) *Attorney, Agent, or Firm* — Wenderoth, Lind & Ponack, L.L.P.

(57) ABSTRACT

A thermoelectric power module capable of withstanding a long time use in a high temperature environment where a temperature (Th) of a higher temperature portion exceeds 250° C. The thermoelectric power module includes: a thermoelectric power element; a first diffusion prevention layer consisting of molybdenum (Mo) and disposed on a surface of the thermoelectric power element; a second diffusion prevention layer consisting of an intermetallic compound of nickel-tin (Ni—Sn) and disposed on a surface of the first diffusion prevention layer opposite to the thermoelectric power element side; an electrode; a third diffusion prevention layer consisting of an intermetallic compound of nickel-tin (Ni—Sn) and disposed on a surface of the electrode; a solder layer containing lead (Pb) at not less than 85% and configured to join the second diffusion prevention layer and the third diffusion prevention layer to each other.

4 Claims, 11 Drawing Sheets

(51) Int. Cl.
  *H01L 35/08*   (2006.01)
  *H01L 35/00*   (2006.01)
  *H01L 35/32*   (2006.01)

(58) Field of Classification Search
  USPC ........................................ 136/200, 205, 203
  See application file for complete search history.

(56) References Cited

FOREIGN PATENT DOCUMENTS

| JP | 64-80932 | 3/1989 |
| JP | 7-142246 | 6/1995 |
| JP | 10-135523 | 5/1998 |
| JP | 2002-164463 | 6/2002 |
| JP | 2003-037301 | 2/2003 |
| JP | 2003282974 A * | 10/2003 |
| JP | 2004-140250 | 5/2004 |
| JP | 2005-340565 | 12/2005 |
| JP | 2008-10612 | 1/2008 |
| JP | 2009-231317 | 10/2009 |

OTHER PUBLICATIONS

English machine translation of JP10-135523.*
English machine translation of JP2003-282974.*
English machine translation of JP 2004-140250A.*
Vassilev et al. "Enthalpies of formation of Ni—Sn compounds". Thermochimica Acta 447 (2006) 106-108.*
Erik Tegehall. "Review of the impact of intermetallic layers on the brittleness of tin-lead and lead-free solder joints". IVF Project reposrt. Jun. 2007.*
Flandorfer et al. "Interfaces in lead-free solder alloys: Enthalpy of formation of binary Ag—Sn, Cu—Sn and Ni—Sn intermetallic compounds". Thermochimica Acta 459 (2007) 34-39.*
International Search Report issued Aug. 2, 2011 in International (PCT) Application No. PCT/JP2011/053596.
Office Action issued Jul. 2, 2014 in corresponding Chinese patent application No. 201180009621.0 (with English translation).
Office Action issued Jan. 21, 2014 in corresponding Japanese patent application No. 2010-036474 with English translation.

* cited by examiner

THERMOELECTRIC POWER MODULE

CROSS REFERENCE TO RELATED APPLICATIONS

This application is a national stage filing under 35 U.S.C. 371 of PCT/JP2011/053596, filed Feb. 14, 2011 and claims priority to Japanese Application No. 2010-036474, filed Feb. 22, 2010.

BACKGROUND OF THE INVENTION

1. Technical Field

The present invention relates to a thermoelectric power module using thermoelectric elements and thereby generating electricity by utilizing difference in temperature.

2. Description of the Related Art

Conventionally, thermoelectric generation of electricity is known in which the thermoelectric power elements are disposed between a heat exchanger at a higher temperature side and another heat exchanger at a lower temperature side generate electricity. The thermoelectric power element is an application s a thermoelectric effect to be called Seebeck effect. In the case where a semiconductor material is used as a thermoelectric material, the thermoelectric power module is configured by combining at least one thermoelectric power element formed of a P-type thermoelectric material and at least one thermoelectric power element formed of an N-type thermoelectric material. Such a thermoelectric power module has a simple structure and can be easily treated, and a stable characteristic can be maintained. Therefore, research work thereof has been widely progressed toward application for the thermoelectric generation of electricity in which electricity is generated by utilizing heat in a gas discharged from an engine of a car, a furnace of a factory, and so on.

In the meantime, the thermoelectric power module is used in a temperature environment where difference between a temperature (Th) at a higher temperature portion and a temperature (Tc) at a lower temperature portion becomes as large as possible in order to obtain high thermoelectric conversion efficiency. For example, a thermoelectric power module employing a typical thermoelectric material of bismuss-tellurium (Bi—Te) system is used in a temperature environment where a temperature (Th) at the higher temperature portion becomes 280° C. at maximum.

A use for a conventional thermoelectric module is mainly cooling, and as solder for connecting electrodes to a thermoelectric element, solder of eutectic system having a composition of 37% Pb-63% Sn or lead-free solder such as Sn—Ag—Cu or the like has been used. Further, in order to prevent solder from diffusing into the thermoelectric element, nickel (Ni) or an intermetallic compound of nickel-tin (Ni—Sn) has been used (See Japanese patent application publication JP-A-10-135523). As an electrode, copper (Cu) is generally used, and in order to increase wettability for solder, a nickel film is usually formed on the electrode by means of plating or the like.

In JP-A-10-135523, it is pointed out that in a thermoelectric device using nickel as a diffusion prevention layer for preventing solder from diffusing into a thermoelectric element, a thin diffusion prevention layer having a thickness of several micro meters cannot precisely prevent the diffusion. On the other hand, it is pointed out that in the case where a thick diffusion prevention layer of nickel is used, although the thick layer of nickel strongly prevents the diffusion along a boundary layer of the block, contact strength between the thick layer of nickel and the thermoelectric element is decreased.

Accordingly, in order to make more progress of an effect of the diffusion prevention and increase strength of a structure of the diffusion prevention layer to raise reliability of the thermoelectric device, patent document 1 (JP-A-10-135523) discloses that a structure of the diffusion prevention layer of the thermoelectric device, which has N-type and P-type conductive elements and connector plates for connecting the N-type and P-type conductive elements to an electric circuit, is at least one layer made of an intermetallic compound of Ni—Sn and having a thickness of 50-3000 μm. Further, it is disclosed that a structure of the diffusion prevention layer is a metal layer consisting of a layer of an intermetallic compound of Ni—Sn and a connection layer containing tin.

On the other hand, in the case where a purpose is to generate electricity, in order to enable use of the thermoelectric module at a high temperature, it is proposed to use solder containing lead (Pb) at 85% or more as solder for connecting an electrode to a thermoelectric element (See Japanese patent application publication JP-P2009-231317A).

JP-P2009-231317A discloses a thermoelectric module in which a height of the thermoelectric module (in a height direction of a thermoelectric element) is made constant to ensure sufficient joining strength, and destruction due to overflow of solder can be prevented from occurring. This thermoelectric module consists of a P-type thermoelectric element, an N-type thermoelectric element, electrode embers, and solder for joining them, and the solder is configured of a solder substrate and particles (copper balls) Further, JP-P2009-231317A discloses that the solder substrate contains lead at 85% or more. Since the content percentage of lead in the solder is 85% or more even at a high temperature of 260° C., for example, the solder keeps joining without being melted, and therefore, the electrode members and the thermoelectric elements can be favorably joined to each other.

Further, as a diffusion prevention film of a thermoelectric element, it is proposed to use a molybdenum (Mo) film or the like (See Japanese patent application publication JP-P2008-10612A). As a solder joint layer, a nickel film has been conventionally used.

JP-P2008-10612A discloses a thermoelectric element in which a diffusion prevention layer can be formed, which layer is effective for preventing diffusion of chemical element into a thermoelectric material including at least one of bismuth, tellurium, selenium and antimony, and which layer has high peel strength. This thermoelectric element has a thermoelectric material including at least two of bismuth (Bi), tellurium (Te) selenium (Se) and antimony (Sb), a diffusion prevention layer formed on the thermoelectric material and for preventing diffusion of different elements into the thermoelectric material, and a solder joint layer for joining the diffusion prevention layer and solder to each other, wherein peel strength between the thermoelectric layer and the diffusion prevention layer or between the diffusion prevention layer and the solder joint layer is 0.6 MPa or more. Further, JP-P2008-10612A discloses that the diffusion prevention layer includes any one of molybdenum (Mo), tungsten (W) niobium (Nb) and tantalum (Ta).

However, in the high temperature environment where a temperature of a higher temperature portion exceeds 250° C., and in the case where nickel is used as a diffusion prevention layer for preventing solder from diffusing into thermoelectric element, on the contrary, there occurs a problem that nickel diffuses into a solder layer and makes segregation, and a resistance value of a joined interface increases. Alternatively, copper in an electrode diffuses via the solder layer into the thermoelectric element, and a resistance value of the thermoelectric element increases. Thereby, output power of the thermoelectric module decreases in use for a long time of 1000-2000 hours.

SUMMARY OF INVENTION

Technical Problem

Accordingly, in view of the above-mentioned points, an object of the present invention is to provide thermoelectric power module capable of withstanding a long time use under a high temperature environment where a temperature of a higher temperature portion exceeds 250° C.

Solution to Problem

In order to achieve the above-mentioned object, a thermoelectric power module according to one aspect of the present invention includes: a thermoelectric power element; a first diffusion prevention layer consisting of molybdenum (Mo) and disposed on a surface of the thermoelectric power element; a second diffusion prevention layer consisting of an intermetallic compound of nickel-tin (Ni—Sn) and disposed on a surface of the first diffusion prevention layer opposite to the thermoelectric power element side; an electrode; a third diffusion prevention layer consisting of an intermetallic compound of nickel-tin (Ni—Sn) and disposed on a surface of the electrode; a solder layer containing lead (Pb) at not less than 85% and configured to join the second diffusion prevention layer and the third diffusion prevention layer to each other.

Advantageous Effects of Invention

In the case where molybdenum is used as a diffusion prevention layer for preventing solder from diffusing into a thermoelectric power element, molybdenum is not favorably joined to the solder, and favorable joint becomes possible by disposing a nickel layer between the diffusion prevention layer of molybdenum and the solder layer. However, there occurs a problem that nickel diffuses into solder in a high temperature environment. According to one aspect of the present invention, nickel is changed to an intermetallic compound of nickel-tin so as to suppress diffusion of nickel into the solder layer. Therefore, it is possible to provide a thermoelectric power module capable of withstanding a long time use in a high temperature environment where a temperature of a higher temperature portion exceeds 250° C.

DETAILED DESCRIPTION OF THE INVENTION

Figure 1:
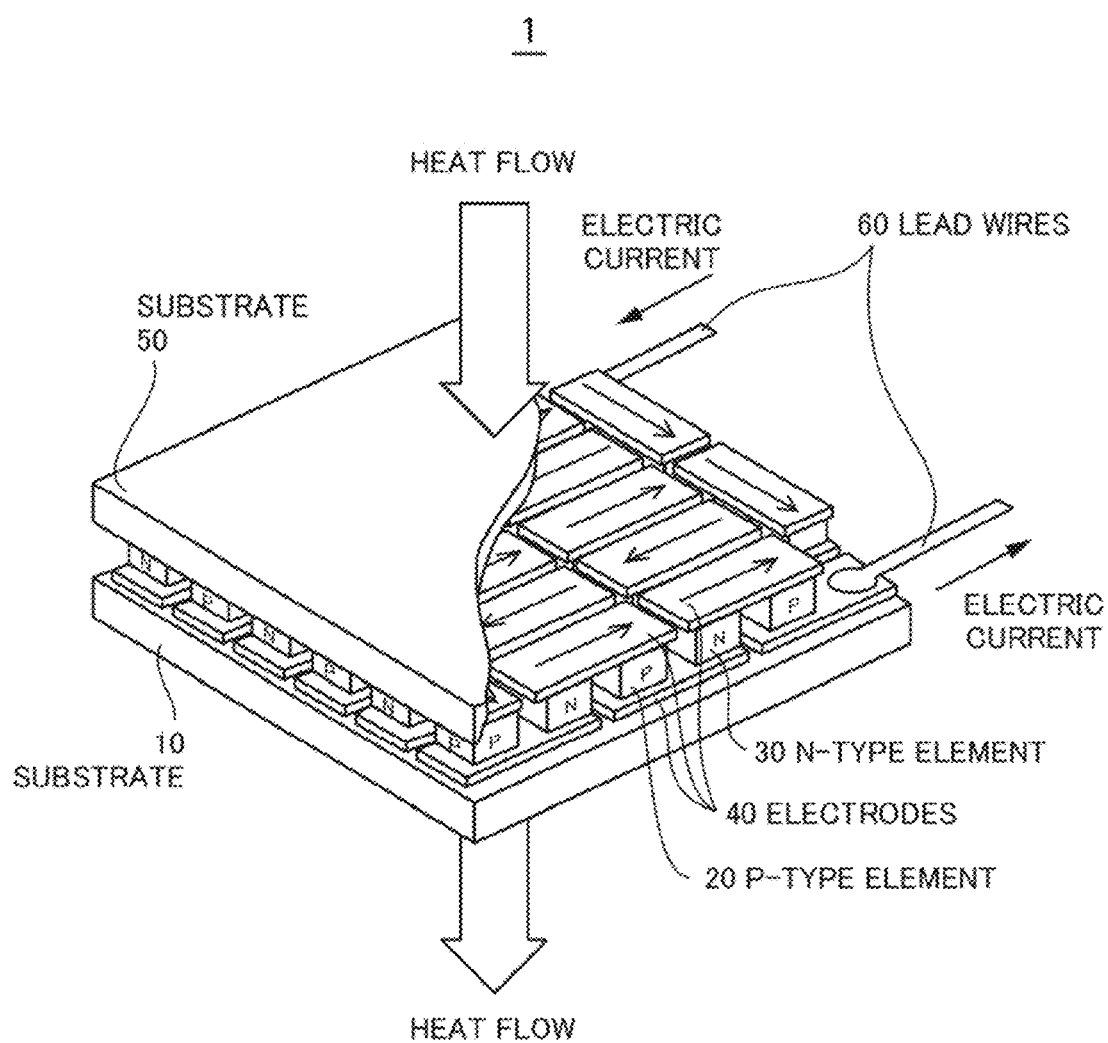
FIG. 1 is a perspective diagram showing an outline of a thermoelectric power module according to embodiments of the present invention.

Hereinafter, embodiments of the present invention will be explained in detail by referring to the drawings. The same reference characters are assigned to the same component elements and the description thereof will be omitted.

FIG. 1 is a perspective diagram showing an outline of a thermoelectric power module according to embodiments of the present invention. In the thermoelectric power module 1, on a substrate (heat exchange substrate) 10 formed of an electric insulation material such as ceramics, for example, a thermoelectric power element (P-type element) 20 formed of P-type thermoelectric material and a thermoelectric power element (N-type element) 30 formed of N-type thermoelectric material are joined via an electrode 40, and thereby, PN element pair is configured. Further, a substrate (heat exchange substrate) 50 formed of an electric insulation material is disposed thereon. In addition, the substrate 10 and/or the substrate 50 may be omitted such that the electrode 40 may be in directly contact with a surface of heat exchanger having electric insulation.

In the embodiment, both P-type element 20 and N-type element 30 are formed of a thermoelectric material including at least two of bismuth (Bi), tellurium (Te) selenium (Se) and antimony (Sb). Especially, in a temperature environment where a temperature of a higher temperature portion becomes 280° C. at maximum, a thermoelectric material of bismuth-tellurium (Bi—Te) system is suitable.

Lead wires 60 are electrically connected via electrodes to the P-type element at one end and the N-type element at the other end of PN element pairs including plural P-type elements 20 and plural a-type elements 30. When cooling the substrate 10 side by coolant or the like and supplying heat to the substrate 50 side, electromotive force is generated in the thermoelectric power module. When a load (not shown) connected between the lead wires 60, an electric current flows as shown in FIG. 1. That is, by supplying difference in temperature between both surfaces of the thermoelectric power module 1 (an upper portion and a lower portion in the drawing), electric power can be extracted.

Figure 2:
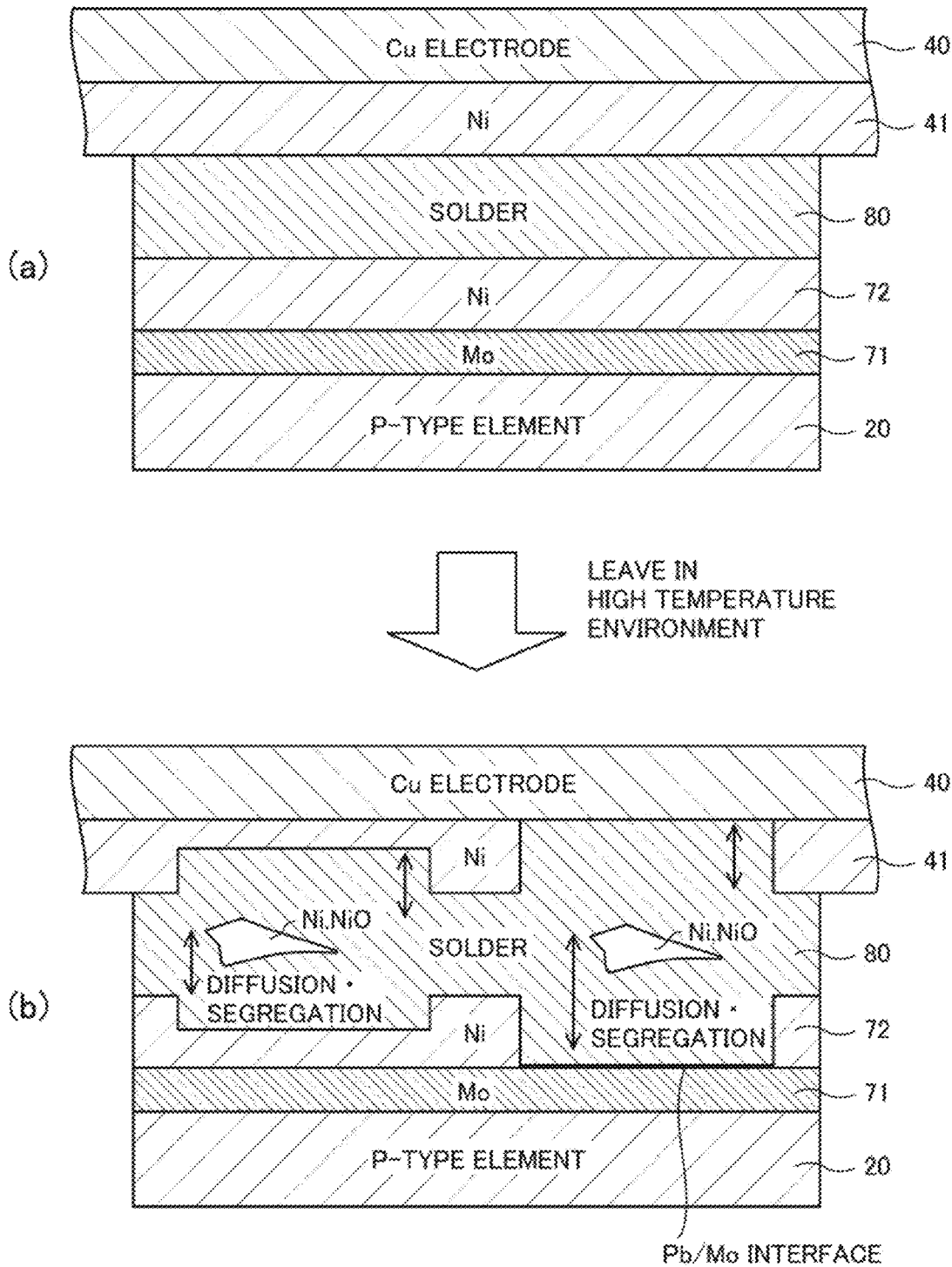
FIG. 2 is an enlarged cross section diagram showing a part of a thermoelectric power module according to a comparative example, in which FIG. 2(a) conceptually shows an initial state of the thermoelectric power module, and FIG. 2(b) conceptually shows a state of the thermoelectric power module after being left in a high temperature environment for a long time.

FIG. 2 is an enlarged cross section diagram showing a part of a thermoelectric power module according to a comparative example. FIG. 2 shows P-type element 20 as an example of a thermoelectric power element. Further, FIG. 2(a) conceptually shows an initial state of the thermoelectric power module, and FIG. 2(b) conceptually shows a state of the thermoelectric power module after being left in a high temperature environment for a long time.

As shown in FIG. 2(a), in this thermoelectric power module, a diffusion prevention layer 71 is formed of molybdenum (Mo) on a main surface (upper surface in the drawing) of the thermoelectric power element (O-type element) 20, and a diffusion prevention layer 72 is formed of nickel (Ni) on a surface of the diffusion prevention layer 71 opposite to the thermoelectric power element side. On the other hand, a diffusion prevention layer 41 is formed of nickel (Ni) on a main surface (lower surface in the drawing) of an electrode 40 formed of copper (Cu). Further, the diffusion prevention layer 72 and the diffusion prevention layer 41 are joined to face each other by a solder layer 80 containing lead (Pb) at 85% or more.

Thus, forming molybdenum as the diffusion prevention layer 71, a component of nickel (Ni) is prevented from diffusing into the thermoelectric power element. On the other hand, by using nickel (Ni) as the diffusion prevention layer 72, solder in the solder layer 80 is prevented from diffusing into the thermoelectric power element. Further, when copper in the electrode 40 diffuses into the solder layer 80, there is a fear that copper further diffuses into the thermoelectric power element, which increases a resistance value of the thermoelectric power element and reduces output power of the thermoelectric power module. Therefore, by employing nickel (Ni) as a diffusion prevention layer 41, copper in the electrode 40 is prevented from diffusing into the solder layer 80 or the thermoelectric power element. Together, by disposing nickel (Ni) on the diffusion prevention layer 71 and the electrode 40, wettability for solder can be improved.

However, when the thermoelectric power module according to the comparative example is left in a high temperature environ environment for a long time, as shown in FIG. 2(b), nickel forming the diffusion prevention layers 72 and 41 diffuses into the solder layer 80, and makes segregation as nickel (Ni) or nickel oxide (Ni—O). Thus, nickel combines with oxygen to become nickel oxide and leaves from the diffusion prevention layers 71 and 41, and solder diffuses thereinto, and thereby, nickel forming the diffusion prevention layers 72 and 41 continuously reduces.

As a result, a part of diffusion prevention layers 72 and 41 or the whole diffusion prevention layer 72 or 41 disappears, and joining due to Ni—Mo alloy that existed at an interface between the diffusion prevention layer 72 and the diffusion prevention layer 71 is cut off. In the region where the diffusion prevention layer 72 disappears, an interface (Pb/Mo interface) between the solder layer 80 and the diffusion prevention layer 71 appears, however, lead (Pb) and molybdenum (Mo) do not form alloy and resistance at the interface increases. Due to the increase of the resistance value, there occurs a problem that output power of the thermoelectric power module reduces.

Figure 3:
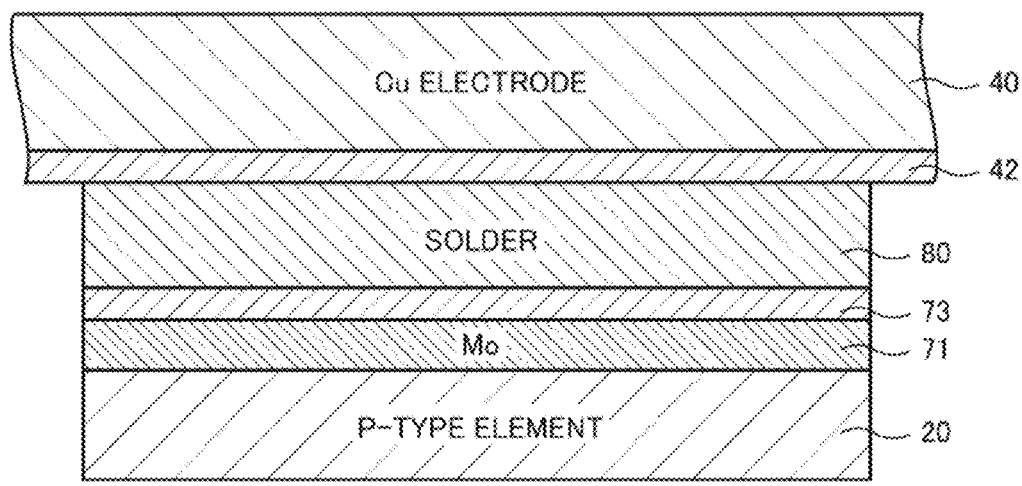
FIG. 3 is an enlarged cross section diagram showing a part of a thermoelectric power module according to a first embodiment of the present invention.

FIG. 3 is an enlarged cross section diagram showing a part of a thermoelectric power module according to a first embodiment of the present invention. FIG. 3 shows P-type element 20 as an example of a thermoelectric power element. As shown in FIG. 3, in this thermoelectric power module, a diffusion prevention layer 71 is formed of molybdenum (Mo) on a main surface (upper surface in the drawing) of a thermoelectric power element (P-type element) 20, and a diffusion prevention layer 73 is formed of an intermetallic compound of nickel-tin (Ni—Sn) on a surface of the diffusion prevention layer 71 opposite to the thermoelectric power element side.

On the other hand, a diffusion prevention layer 42 is formed of an intermetallic compound of nickel-tin (Ni—Sn) on a main surface (lower surface in the drawing) of an electrode 40 formed of copper (Cu). Further, the diffusion prevention layer 73 and the diffusion prevention layer 42 are joined to face each other by a solder layer 80 containing lead (Pb) at 1% or more.

Thereby, the diffusion prevention layer 71 of molybdenum is disposed on the P-type element 20, the diffusion prevention layer 73 of the intermetallic compound of nickel-tin is disposed on the diffusion prevention layer 71, the solder layer 80 is disposed on the diffusion prevention layer 73, the diffusion prevention layer 42 of the intermetallic compound of nickel-tin is disposed on the solder layer 80, and the electrode 40 is disposed on the diffusion prevention layer 42. The thickness of each diffusion prevention layer in the embodiment is within a range from 0.1 μm to 20 μm.

Preferably, a percentage content of lead in the solder layer 80 is 90% or more, and in this case, a melting point of the solder becomes 275° C. or higher. More preferably, a percentage content of lead in the solder layer 80 is 95% or more, and in this case, a melting point of the solder becomes 305° C. or higher. Further, in the case where a percentage content of lead in the solder layer 80 is 98% or more, a melting point of the solder becomes 317° C. or higher.

According to the embodiment, since nickel to be disposed on the diffusion prevention layer 71 of molybdenum is changed to the intermetallic compound of nickel-tin, even if the thermoelectric power module is left in a high temperature environment for a long time, diffusion of nickel into the solder layer 80 is suppressed. This is because energy is required when the intermetallic compound of nickel-tin (Ni—Sn) forming the diffusion prevention layers 73 and 42 is decomposed into nickel (Ni) and tin (Sn), and more energy is required for nickel included in the intermetallic compound to diffuse into solder than that required for nickel alone to diffuse into solder, which will be explained in detail later. By suppressing diffusion of nickel into the solder layer 80, an interface (Pb/Mo interface) between the solder layer 80 and the diffusion prevention layer 71 does not appear. Therefore, increase of the resistance of the interface is suppressed, and reduction of output power of the thermoelectric module due to increase of the resistance value hardly occurs. Accordingly, it is possible to provide a thermoelectric power module capable of withstanding long time use in a high temperature environment where a temperature of a higher temperature portion exceeds 250° C.

Figure 4:
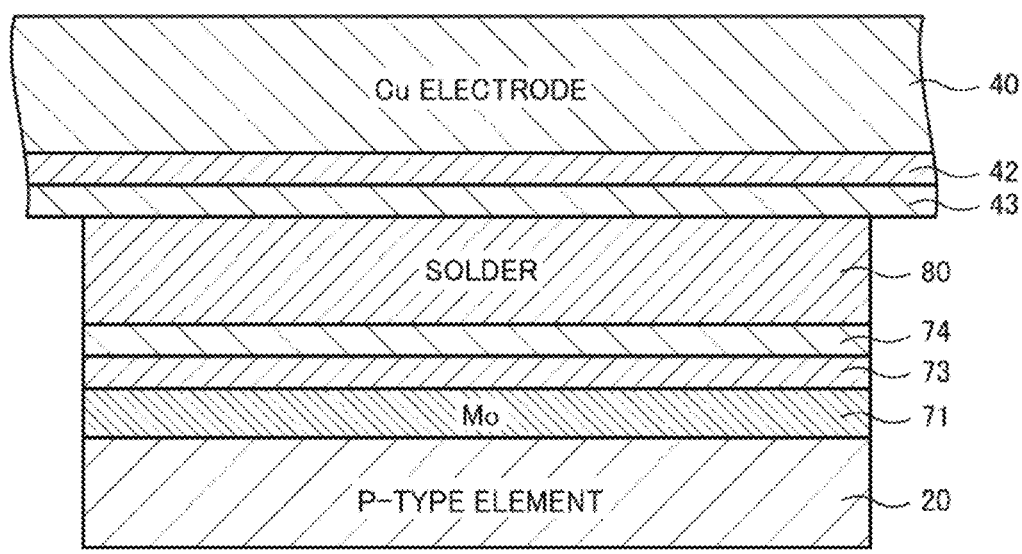
FIG. 4 is an enlarged cross section diagram showing a part of a thermoelectric power module according to a modification of the first embodiment of the present invention.

FIG. 4 is an enlarged cross section diagram showing a part of a thermoelectric power module according to a modification of the first embodiment of the present invention. As shown in FIG. 4, in this thermoelectric power module, a diffusion prevention layer 71 is formed of molybdenum (Mo) on a main surface (upper surface in the drawing) of a thermoelectric power element (P-type element) 20, and a diffusion prevention layer 73 is formed of an intermetallic compound of nickel-tin (Ni—Sn) on a surface of the diffusion prevention layer 71 opposite to the thermoelectric power element side. Further, a solder joint layer 74 is formed of tin (Sn) on a surface of the diffusion prevention layer 73 opposite to the diffusion prevention layer 71 side.

On the other hand, a diffusion prevention layer 42 is formed of an intermetallic compound of nickel-tin (Ni—Sn) on a main surface (lower surface in the drawing) of an electrode 40 formed of copper (Cu) and a solder joint layer 43 is formed of tin (Sn) on a surface of the diffusion prevention layer 42 opposite to the electrode side. Further, the diffusion prevention layer 74 and the diffusion prevention layer 43 are joined to face each other by a solder layer 80 containing lead (Pb) at 85% or more.

Thereby, the diffusion prevention layer 71 of molybdenum is disposed on the P-type element 20, the diffusion prevention layer 73 of the intermetallic compound of nickel-tin is disposed on the diffusion prevention layer 71, the solder joint layer 74 of tin is disposed on the diffusion prevention layer 73, the solder layer 80 is disposed on the solder joint layer 74, the solder joint layer 43 of tin is disposed on the solder layer 80, the diffusion prevention layer 42 of the intermetallic compound of nickel-tin is disposed on the solder joint layer 43, and the electrode 40 is disposed on the diffusion prevention layer 42. The thickness of each diffusion prevention layer and the thickness of each solder joint layer in the modification are within a range from 0.1 μm to 20 μm.

Thus, by forming the solder joint layers 74 and 43 of tin on the diffusion prevention layers 73 and 42 formed of the intermetallic compound of nickel-tin (Ni—Sn) respectively, since a melting point of tin is near to a melting point of solder, wettability for solder can be improved. Also in the modification of the first embodiment, diffusion of nickel into the solder layer 80 is suppressed, and thereby, an interface (Pb/Mo interface) between the solder layer 80 and the diffusion prevention layer 71 does not appear. Therefore, increase of the resistance of the interface is suppressed, and reduction of output power of the thermoelectric module due to increase of the resistance value hardly occurs.

Figure 5:
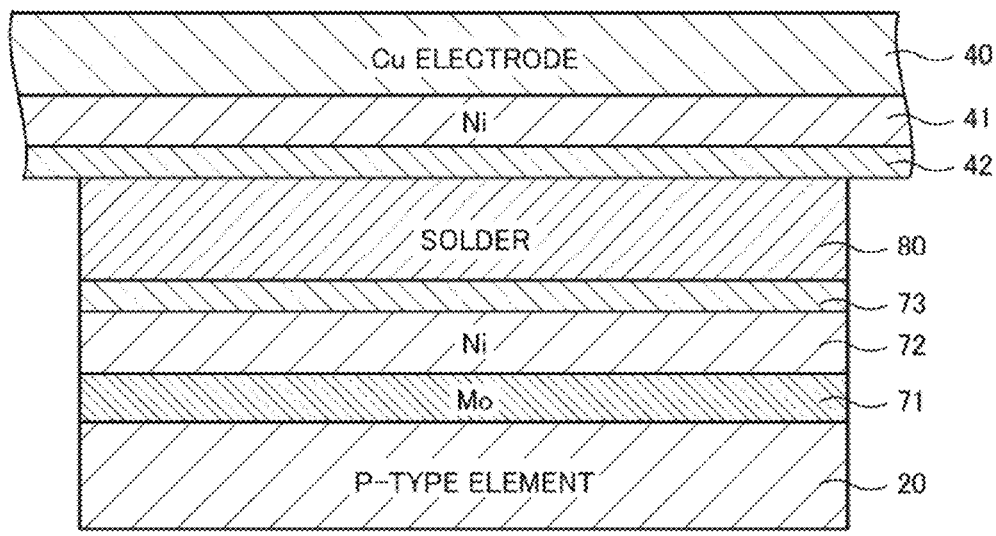
FIG. 5 is an enlarged cross section diagram showing a part of a thermoelectric power module according to a second embodiment of the present invention.

FIG. 5 is an enlarged cross section diagram showing a part of a thermoelectric power module according to a second embodiment of the present invention. FIG. 5 shows a P-type element 20 as an example of a thermoelectric power element. As shown in FIG. 5, in this thermoelectric power module, a diffusion prevention layer 71 is formed of molybdenum (Mo) on a main surface (upper surface in the drawing) of the thermoelectric power element (P-type element) 20, and a diffusion prevention layer 72 is formed of nickel (Ni) on a surface of the diffusion prevention layer 71 opposite to the thermoelectric power element side. Further, a diffusion prevention layer 73 is formed of an intermetallic compound of nickel-tin (Ni—Sn) on a surface of the diffusion prevention layer 72 opposite to the diffusion prevention layer 71 side.

On the other hand, a diffusion prevention layer 41 is formed of nickel (Ni) on a main surface (lower surface in the drawing) of an electrode 40 formed of copper (Cu), and a diffusion prevention layer 42 is formed of an intermetallic compound of nickel-tin (Ni—Sn) on a surface of the diffusion prevention layer 41 opposite to the electrode side. Further, the diffusion prevention layer 73 and the diffusion prevention layer 42 are joined to face each other by a solder layer 80 containing lead (Pb) at 85% or more.

Thereby, the diffusion prevention layer 71 consisting of molybdenum is disposed on the P-type element 20, the diffusion prevention layer 72 consisting of nickel is disposed on the diffusion prevention layer 71, the diffusion prevention layer 73 consisting of the intermetallic compound of nickel-tin is disposed on the diffusion prevention layer 72, the solder layer 80 is disposed on the diffusion prevention layer 73, the diffusion prevention layer 42 consisting of the intermetallic compound of nickel-tin is disposed on the solder layer 80, the diffusion prevention layer 41 consisting of nickel is disposed on the diffusion prevention layer 42, and the electrode 40 is disposed on the diffusion prevention layer 41. The thickness of each diffusion prevention layer the embodiment is within a range from 0.1 μm to 20 μm.

Preferably, a percentage content of lead in the solder layer 80 is 90% or more, and in this case, a melting point of the solder becomes 275° C. or higher. More preferably, a percentage content of lead in the solder layer 80 is 95% or more, and in this case, a melting point of the solder becomes 305° C. or higher. Further, in the case where a percentage content of lead in the solder layer 80 is 98% or more, a melting point of the solder becomes 317° C. or higher.

The thermoelectric power element causes deformation in a high temperature environment, and thereby, stress is added to the thermoelectric power element at joining portion. Further, since the diffusion prevention layer 71 of molybdenum is thinner than the thermoelectric power element, the diffusion prevention layer 71 causes similar deformation in accordance with the deformation of the thermoelectric power element in the high temperature environment, and thereby, stress is added to the diffusion prevention layer 71. According to the embodiment, by disposing the diffusion prevention layer 72 of nickel between the diffusion prevention layer 71 of molybdenum and the diffusion prevention layer 73 of nickel-tin, the stress added to the thermoelectric power element and the diffusion prevent ion layer 71 can be lightened.

Further, since the diffusion prevention layers 73 and 41 of nickel-tin exist, diffusion of nickel forming the diffusion prevention layers 72 and 41 into the solder layer 80 is suppressed. By suppressing diffusion of nickel into the solder layer 80, an interface (Pb/Mo interface) between the solder layer 80 and the diffusion prevention layer 71 does not appear. Thereby, increase of interface resistance suppressed, and reduction of output power of the thermoelectric power module hardly occurs. Therefore, it is possible to provide a thermoelectric power module capable of withstanding long time use in a high temperature environment where a temperature of a higher temperature portion exceeds 250° C.

Figure 6:
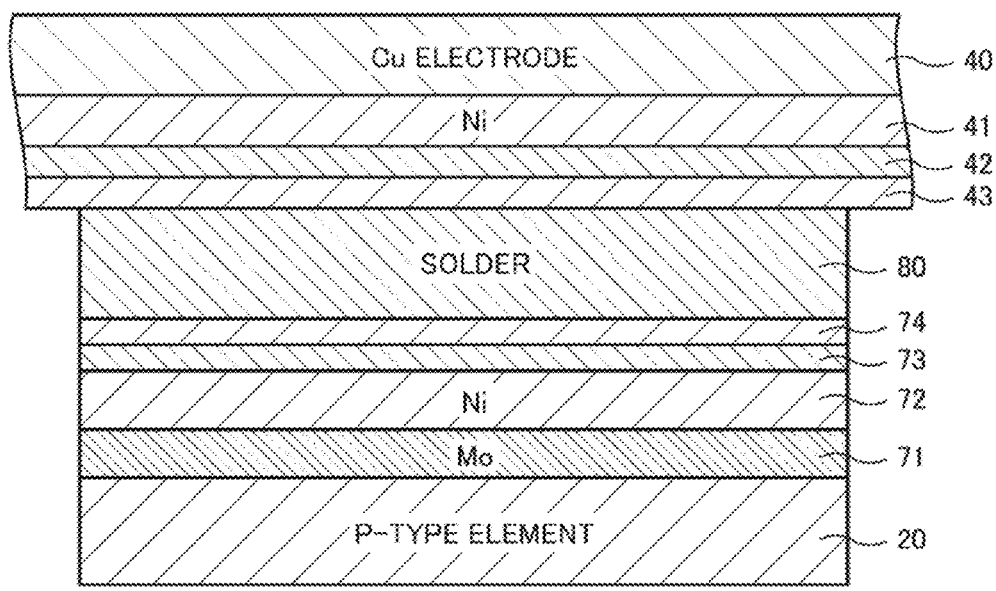
FIG. 6 is an enlarged cross section diagram showing a part of a thermoelectric power module according to a modification of the second embodiment of the present invent ion.

FIG. 6 is an enlarged cross section diagram showing a part of a thermoelectric power module according to a modification of the second embodiment of the present invention. As shown in FIG. 6, in this thermoelectric power module, a diffusion prevention layer 71 is formed of molybdenum (Mo) on a main surface (upper surface in the drawing) of the thermoelectric power element (P-type element) 20, a diffusion prevention layer 72 is formed of nickel (Ni) on a surface of the diffusion prevention layer 71 opposite to the thermoelectric power element side, and a diffusion prevention layer 73 is formed of an intermetallic compound of nickel-tin (Ni—Sn) on a surface of the diffusion prevention layer 72 opposite to the diffusion prevention layer 71 side. Further, a solder joint layer 74 is formed of tin (Sn) on a surface of the diffusion prevention layer 73 opposite to the diffusion prevention layer 72 side.

On the other hand, a diffusion prevention layer 41 is formed of nickel (Ni) on a main surface (lower surface in the drawing) of an electrode 40 formed of copper (Cu), a diffusion prevention layer 42 is formed of an intermetallic compound of nickel-tin (Ni—Sn) on a surface of the diffusion prevention layer 41 opposite to the electrode side, and a solder joint layer 43 is formed of tin (Sn) on a surface of the diffusion prevention layer 42 opposite to the diffusion prevention layer 41 side. Further, the diffusion prevention layer 74 and the diffusion prevention layer 43 are joined to face each other by a solder layer 80 containing lead (Pb) at 85% or more.

Thereby, the diffusion prevention layer 71 consisting of molybdenum is disposed on the P-type element 20, the diffusion prevention layer 72 consisting of nickel is disposed on the diffusion prevention layer 71, the diffusion prevention layer 73 consisting of the intermetallic compound of nickel-tin is disposed on the diffusion prevention layer 72, the solder joint layer 74 consisting of tin is disposed on the diffusion prevention layer 73, the solder layer 80 is disposed on the solder joint layer 74, the solder joint layer 43 consisting of tin is disposed on the solder layer 80, the diffusion prevention layer 42 consisting of the intermetallic compound of nickel-tin is disposed on the solder joint layer 43, the diffusion prevention layer 41 consisting of nickel is disposed on the diffusion prevention layer 42, and the electrode 40 is disposed on the diffusion prevention layer 41. The thickness of each diffusion prevention layer and the thickness of each solder joint layer in the modification are within a range from 0.1 μm to 20 μm.

Thus, by forming the solder joint layers 74 and 43 of tin on the diffusion prevention layers 73 and 42 formed of the intermetallic compound of nickel-tin (Ni—Sn), respectively, since a melting point of tin is near to a melting point of solder, wettability for solder can be improved. Also in the modification of the second embodiment, diffusion of nickel into the solder layer 80 is suppressed, and thereby, an interface (Pb/Mo interface) between the solder layer 80 and the diffusion prevention layer 71 does not appear. Therefore, increase of the resistance of the interface is suppressed, and reduction of output power of the thermoelectric module due to increase of the resistance value hardly occurs.

Next, the principle that diffusion of nickel is suppressed in the thermoelectric power module according to the present invention will be explained.

Figure 7:
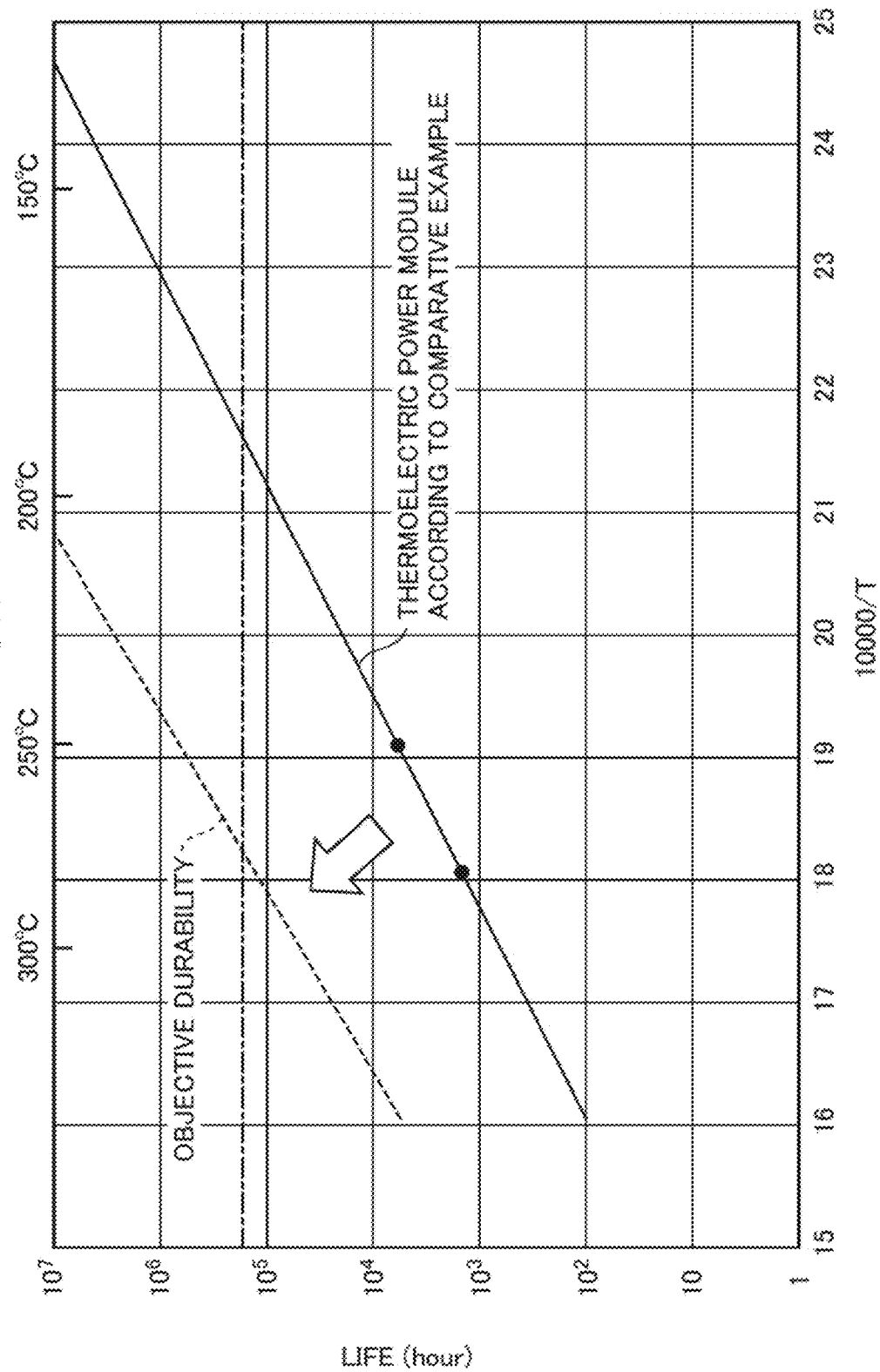
FIG. 7 is a diagram for explanation of a method of expecting a life of a thermoelectric power module according to Arrhenius model.

FIG. 7 is a diagram for explanation of a method of expecting a life of a thermoelectric power module according to Arrhenius model. In FIG. 7, the lower horizontal axis represents a value of a product of 10000 and a reciprocal of an absolute temperature "T", the upper horizontal axis represents a temperature (° C.) corresponding to the lower horizontal axis, and the vertical axis represents life (hour) of the thermoelectric power module. Here, the life of the thermoelectric power module refers to a time period from a time point when use of the thermoelectric module is started to a time point when the output power reduces by 10%.

In FIG. 7, a solid line denotes durability of the thermoelectric power module according to the comparative example calculated based on measured values (black dots). According to Arrhenius model, life "L" of the thermoelectric power module is represented by the next expression (1).

$$L = L_0 \cdot \exp(Ea/RT) \quad (1)$$

In the expression (1), "R" is a gas constant which is a product of Boltzmann's constant and Avogadro's number. Based on the measured values (black dots) of the thermoelectric power module according to the comparative example, a normalization coefficient $L_0$ and activation energy Ea are obtained as follows:

$$L_0 = 4.79 \times 10^{-8}$$

$$Ea = 110 \text{ kJ/mol}$$

It is assumed that the life of the thermoelectric power module according to the comparative example is defined by diffusion of nickel into a solder layer, the activation energy Ea represents energy necessary for nickel forming the diffusion prevention layer 72 or 41 as shown in FIG. 2 to diffuse into a solder layer containing lead (Pb) at 85% more.

As denoted by a dashed line in FIG. 7, in the case where a target life of the thermoelectric power module is twenty years ($1.75 \times 10^5$ hours), a durability temperature of the thermoelectric power module according to the comparative example at maximum working temperature is about 190° C. However, a thermoelectric power module employing a thermoelectric material of bismuth-tellurium (Bi—Te) system is used in a temperature environment where a temperature (Th) of a higher temperature portion becomes 280° C. at maximum, and in the case where the target life of the thermoelectric power module is twenty years ($1.75 \times 10^5$ hours), it is desired that a durability temperature of the diffusion prevention layer is 280° C. or higher.

In FIG. 7, a broken line denotes a target durability of the thermoelectric power module. According to the target durability, in the case where a target life is twenty years, a durability temperature of the thermoelectric power module is about 280° C. For that purpose, it is necessary that the activation energy Ea is about 130 kJ/mol or more.

As shown in FIGS. 3 and 5, in the first and second embodiments of the present invention, the diffusion prevention layers 73 and 42 formed of an intermetallic compound of nickel-tin are provided adjacent to the solder layer 80. Therefore, activation energy of the intermetallic compound of nickel-tin becomes important rather than activation energy of nickel. As the intermetallic compound of nickel-tin, $Ni_3Sn_4$ is mainly produced, and as others, $Ni_3Sn$ and Ni$_3$Sn$_2$ are produced. Enthalpy of formation when these intermetallic compounds are produced from nickel is as follows:

Ni$_3$Sn: −24.9 kJ/mol
Ni$_3$Sn$_2$: −34.6 kJ/mol
Ni$_3$Sn$_4$: −24.0 kJ/mol (the source: H. Flandorfer et al., "Interfaces in lead-free solder alloys: Enthalpy of formation of binary Ag—Sn, Cu—Sn and Ni—Sn intermetallic compounds", Thermochimica Acta Vol. 459, 1 Jul. 2007, pp. 34-39)

Figure 8:
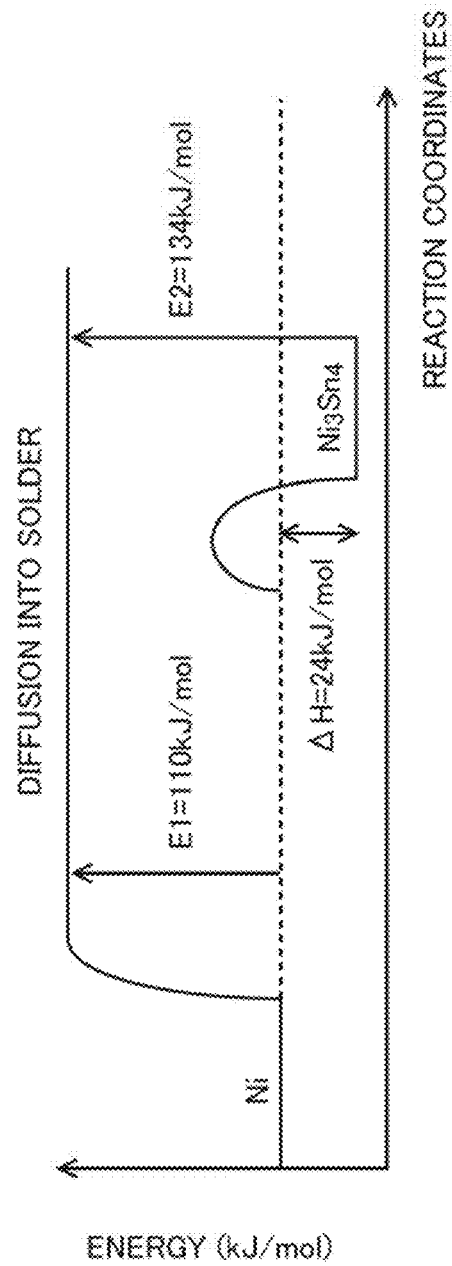
FIG. 8 is a diagram comparatively showing activation energy necessary for nickel alone to diffuse into solder and activation energy necessary for nickel included in an intermetallic compound of nickel-tin to diffuse into solder.

FIG. 8 is a diagram comparatively showing activation energy necessary for nickel alone to diffuse into solder and activation energy necessary for nickel included in an intermetallic compound of nickel-tin to diffuse into solder. In FIG. 8, the horizontal axis represents reaction coordinates, and the vertical axis represents energy (kJ/mol). Here, the case of Ni$_3$Sn$_4$ is explained as an example of an intermetallic compound of nickel-tin.

As shown in FIG. 8, energy E1 necessary for nickel (Ni) to diffuse into a solder layer containing lead (Pb) at 85% or more is 110 kJ/mol. On the hand, enthalpy of formation when Ni$_3$Sn$_4$ is produced from nickel (Ni) is −24 kJ/mol, and therefore, Ni$_3$Sn$_4$ is in an energy state lower than that of nickel alone by difference of enthalpy of formation ΔH=24 kJ/mol. Therefore, energy E2, which is necessary for Ni$_3$Sn$_4$ to be decomposed into nickel (Ni) and tin (Sn) and necessary for nickel (Ni) to diffuse into a solder layer, is 134 kJ/mol.

Since this value is larger than about 130 kJ/mol which is the target value of the activation energy Ea explained by referring to FIG. 7, the durability temperature in the case the target life of the thermoelectric power module is twenty years can be made 280° C. or higher. In the case where Ni$_3$Sn or Ni$_3$Sn$_2$ other than Ni$_3$Sn$_4$ is produced as the intermetallic compound of nickel-tin, the difference of enthalpy of formation ΔH becomes larger, and therefore, the target life can be extended at the same durability temperature, or the durability temperature can be raised.

Next, performance degradation due to diffusion of copper forming the electrode into the thermoelectric power element will be explained.

Figure 9:
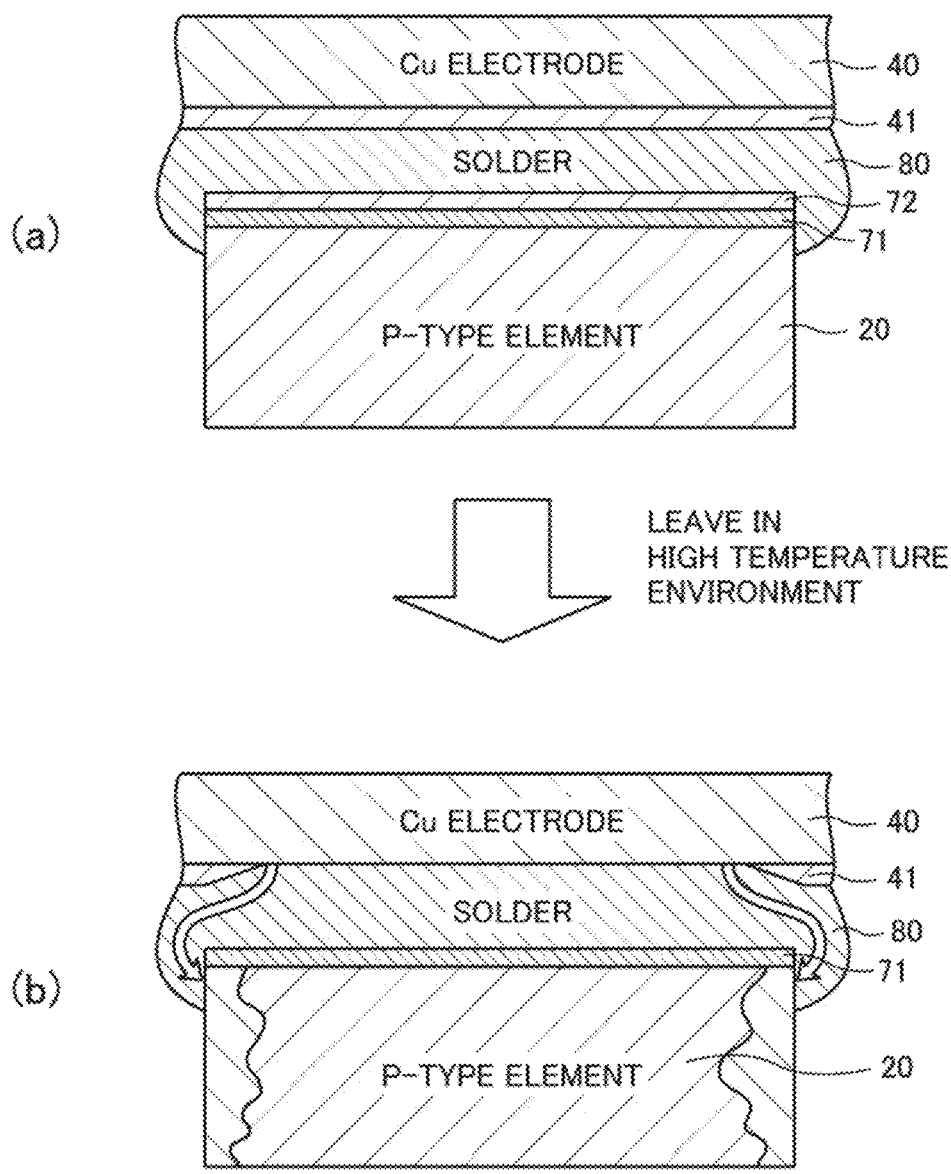
FIG. 9 is an enlarged cross section diagram showing a part of a thermoelectric power module according to a comparative example, in which FIG. 9(a) conceptually shows an initial state of the thermoelectric power module, and FIG. 9(b) conceptually shows a state of the thermoelectric power module after being left in a high temperature environment for a long time.

FIG. 9 is an enlarged cross section diagram showing a part of a thermoelectric power module according to a comparative example. FIG. 9 shows a P-type element 20 as an example of a thermoelectric power element. Further, FIG. 9(a) conceptually shows an initial state of the thermoelectric power module, and FIG. 9(b) conceptually shows a state of the thermoelectric power module after being left in a high temperature environment for a long time.

As shown in FIG. 9(a), in this thermoelectric power module, a diffusion prevention layer 71 is formed of molybdenum (Mo) on a thermoelectric power element (P-type element) 20, and a diffusion prevention layer 72 is formed of nickel (Ni) on the diffusion prevention layer 71. On the other hand, a diffusion prevention layer 41 is formed of nickel (Ni) on a surface of an electrode 40 formed of copper (Cu). Further, the diffusion prevention layer 72 and the diffusion prevention layer 41 are joined by a solder layer 80 having a composition of 98% Pb-2% Sn. In addition, in this comparative example, the solder layer 80 hangs out on a side surface of the diffusion prevention layer 71 and a side surface of the thermoelectric power element to be in contact with the thermoelectric power element.

However, when the thermoelectric pourer module according to the comparative example is left in a high temperature environment for a long time, as shown in FIG. 9(b) forming the diffusion prevention layers 72 and 41 diffuses into the solder layer 80 such that nickel plating disappears in part, and the solder layer 80 becomes in direct contact with the diffusion prevention layer 71 and the electrode 40. In such a condition, there is a fear that copper in the electrode 40 diffuses into the solder layer 80 as denoted by an arrow in the drawing, and further, copper exceeding the solid solubility limit in the solder layer 80 diffuses on a side surface of the thermoelectric power element or into the inside of the thermoelectric power element. Especially, in the case where the solder layer 80 hangs out on a side surface of the diffusion prevention layer 71 and a side surface of the thermoelectric power element, and the solder layer 80 is in contact with the thermoelectric power element, copper is apt to diffuse on the side surface of the thermoelectric power element or into the inside of the thermoelectric power element.

When copper diffuses to the inside of the thermoelectric power element, a resistance value of the N-type element 30 (FIG. 1) is decreases while a resistance value of the P-type element 20 is greatly increases, and therefore, a resistance value of the thermoelectric power module increases as a whole and output power of the thermoelectric power module reduces. This phenomenon is observed as more dominantly as a temperature of an environment where the thermoelectric power module is left is higher.

Figure 10:
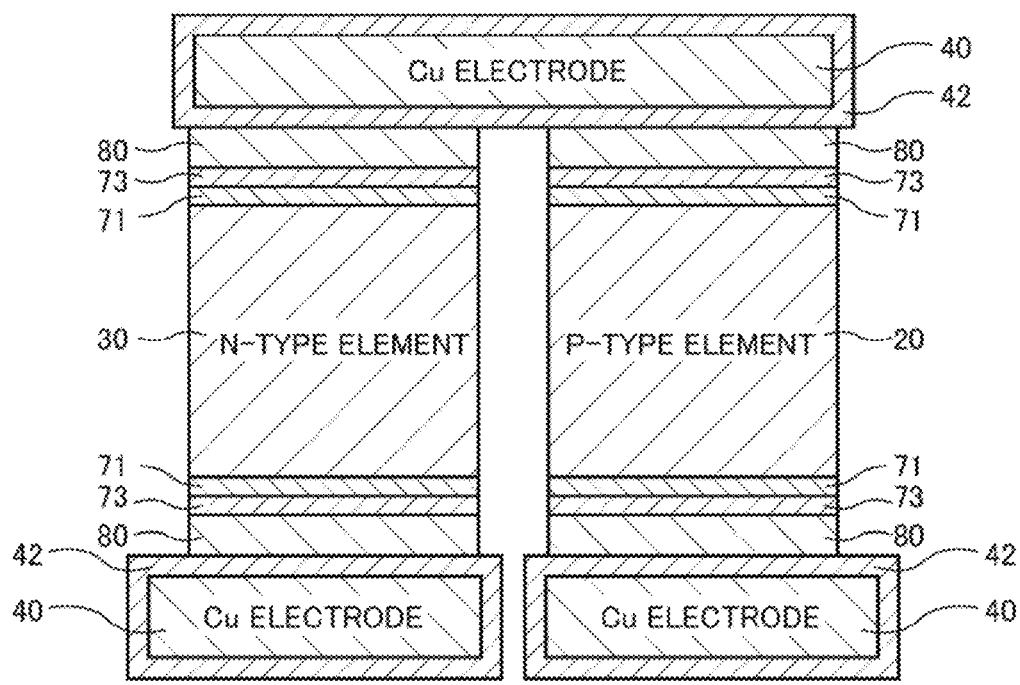
FIG. 10 shows a cross section diagram showing a construction in which P-type and N-type thermoelectric power elements and electrodes are joined in the thermoelectric power module according to the first embodiment of the present invention.

FIG. 10 shows a cross section diagram showing a construction in which P-type and N-type thermoelectric power elements and electrodes are joined in the thermoelectric power module according to the first embodiment of the present invention. As shown in FIG. 10, in this thermoelectric power module, the diffusion prevention layers 71 are formed of molybdenum (Mo) on both surfaces (an upper surface and a lower surface in the drawing) of each of the P-type element 20 and the N-type element 30, and the diffusion prevention layers 73 are formed of an intermetallic compound of nickel-tin (Ni—Sn) on surfaces of the diffusion prevention layers 71 opposite to the thermoelectric power element side.

On the other hand, the diffusion prevention layers 42 are formed of an intermetallic compound of nickel-tin (Ni—Sn) on at least surfaces of the electrodes 40 formed of copper (Cu) at the thermoelectric power element side. Especially, FIG. 10 shows an example in which the diffusion prevention layer 42 is formed on the whole surface of the electrode 40. Further, the diffusion prevention layer 73 and the diffusion prevention layer 42 are joined by the solder layer 80 containing lead (Pb) at 85% or more. In addition, the solder joint layers 74 and 43 may be formed of tin (Sn) in the same manner as that in the modification of the first embodiment.

According to this configurations even if the thermoelectric power module is left in a high temperature environment for a long time, diffusion of nickel into the solder layer 80 is suppressed. This is because energy is necessary when an, intermetallic compound of nickel-tin (Ni—Sn) forming the diffusion prevention layers 73 and 42 is decomposed into nickel (Ni) and tin (Sn), and the energy required for nickel (Ni) included in the intermetallic compound to diffuse into solder is more than that required for nickel alone to diffuse into solder. As a result, it is possible to prevent copper in the electrode 40 from diffusing into the solder layer 80, and prevent copper from diffusing on the side surface or into inside of the P-type element 20 or N-type element 30.

Figure 11:
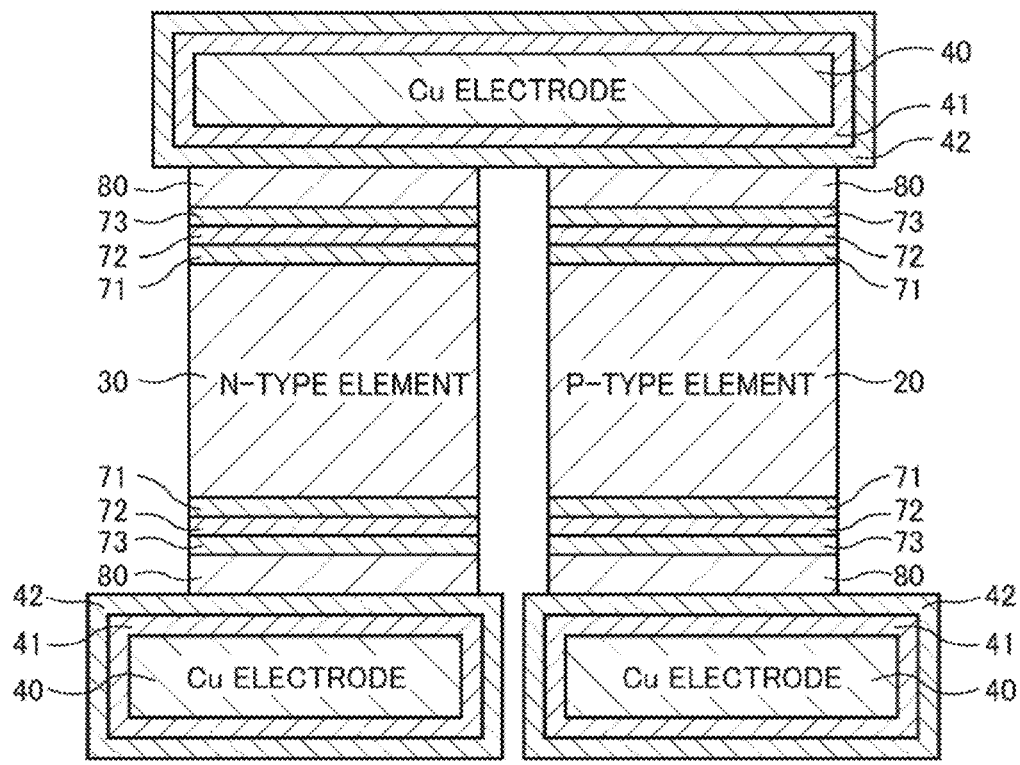
FIG. 11 shows a cross section diagram shows construction in which P-type and N-type thermoelectric power elements and electrodes are joined in the thermoelectric power module according to the second embodiment of the present invention.

FIG. 11 shows a cross section diagram showing a construction in which P-type and N-type thermoelectric power elements and electrodes are joined in the thermoelectric power module according to the second embodiment of the present invention. As shown in FIG. 11, in this thermoelectric power module, the diffusion prevention layers 71 are formed of molybdenum (Mo) on both surfaces (an upper surface and a lower surface in the drawing) of each of the P-type element 20 and the N-type element 30, and the diffusion prevention layers 72 are formed of nickel (Ni) of surfaces of the diffusion prevention layers 71 opposite to the thermoelectric power element side. Further, the diffusion prevention layers 73 are formed of an intermetallic compound of nickel-tin (Ni—Sn) on surfaces of the diffusion prevention layers 72 opposite to the diffusion prevention layer 71 side.

On the other hand, the diffusion prevention layers 41 are formed of nickel (Ni) on at least surfaces of the electrodes 40 formed of copper (Cu) at the thermoelectric power element side, and the diffusion prevention layers 42 are formed of an intermetallic compound of nickel-tin (Ni—Sn) on surfaces of the diffusion prevention layer 41 opposite to the electrode side. Especially, FIG. 11 shows an example in which the diffusion prevention layers 41 and 42 are formed on the whole surface of the electrode 40. Further, the diffusion prevention layer 73 and the diffusion prevention layer 42 are joined by the solder layer 80 containing lead (Pb) at 85% or more. In addition, the solder joint layers 74 and 43 may be formed of tin (Sn) in the same manner as that in the modification of the second embodiment.

According to this configuration, since the diffusion prevention layers 73 and 42 exist, diffusion of nickel forming the diffusion prevention layers 72 and 41 is suppressed. By suppressing diffusion of nickel into the solder layer 80, it is possible to prevent copper in the electrode 40 from diffusing into the solder layer 80, and prevent copper from diffusing on the side surface or into the inside of the P-type electrode 20 or the N-type electrode 30.

Next, an experiment result in which diffusion of nickel is confirmed by using an experiment sample, and an improvement effect according to the present invention will be explained.

Figure 12:
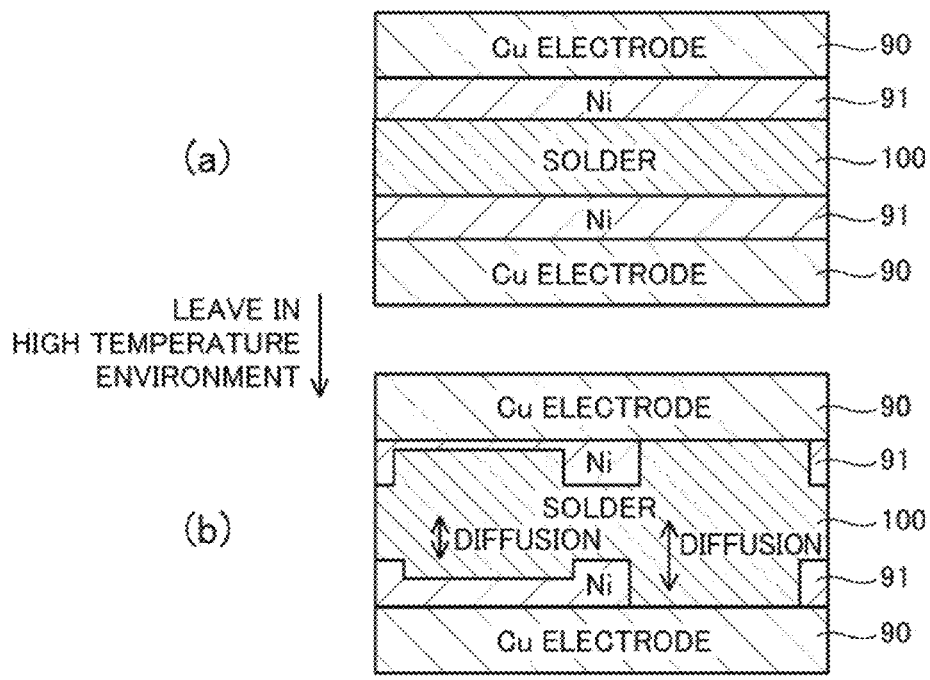
FIG. 12 is a cross section diagram showing an experiment sample "A" which imitates a partial construction of the thermoelectric power module according to the comparative example, in which FIG. 12(a) conceptually shows an initial state of the experiment sample "A", and FIG. 12(b) conceptually shows a state of the experiment sample "A" after being left in a high temperature environment for a long time.

FIG. 12 is a cross section diagram showing an experiment sample "A" which imitates a partial construction of the thermoelectric power module according to the comparative example. FIG. 12(a) conceptually shows an initial state of the experiment sample "A", and FIG. 12(b) conceptually shows a state of the experiment sample "A" after being left in a high temperature environment for a long time. Further, FIG. 13 is a microscope photograph showing the experiment sample "A" after being left in a high temperature environment for a long time.

As shown in FIG. 12(a) in the experiment sample "A", a diffusion prevention layer 91 is formed of nickel (Ni) on an electrode 90 formed of copper (Cu). Two such electrodes are prepared, and two diffusion prevention layers 91 are joined to face each other by a solder layer 100.

When the experiment sample "A" is left in a high temperature environment for a long time, as shown in FIG. 12(b), nickel forming the diffusion prevention layers 91 diffuses into the solder layer 100, and the solder layer 100 comes in directly contact with the electrode 90 in some regions.

Figure 13:
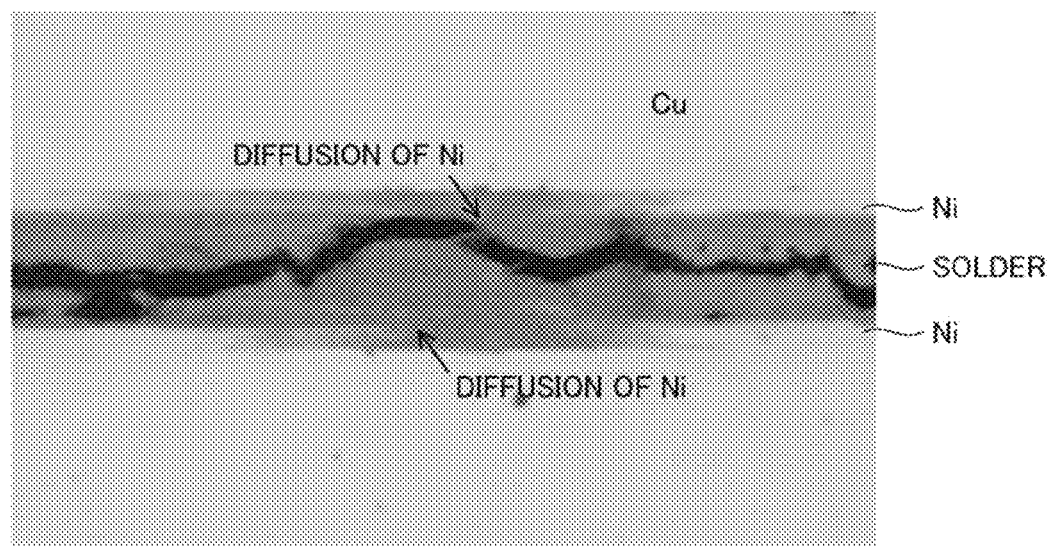
FIG. 13 is a microscope photograph showing the experiment sample "A" after being left in a high temperature environment for a long time.

FIG. 13 shows the experiment sample "A" after being left at a temperature of 280° C. for 1000 hours. The composition of solder used here is 98% Pb-2% Sn. As shown in FIG. 13, nickel (Ni) diffuses and a layer of nickel (Ni) disappears in some regions. As a result the solder layer comes indirect contact with the electrode, and copper (Cu) in the electrode diffuses into the solder layer.

Figure 14:
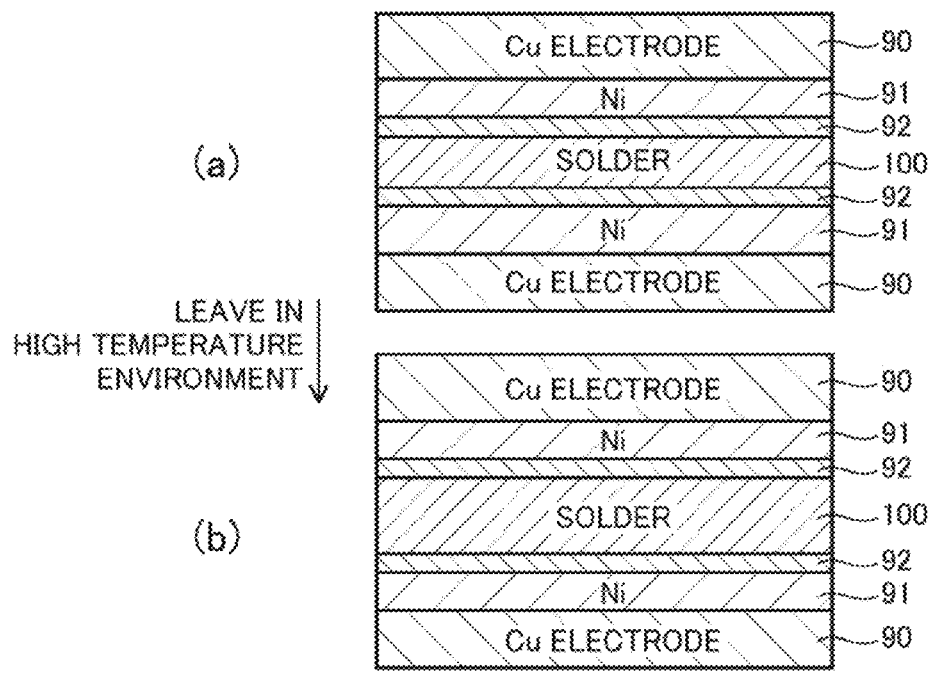
FIG. 14 is a cross section diagram showing an experiment sample "B" which imitates a partial construction of the thermoelectric power module according to the second embodiment of the present invention, in which FIG. 14(a) conceptually shows an initial state of the experiment sample "B", and FIG. 14(b) conceptually shows a state of the experiment sample "B" after being left in a high temperature environment for a long time.

FIG. 14 is a cross section diagram showing an experiment sample "B" which imitates a partial construction of the thermoelectric power module according to the second embodiment of the present invention. FIG. 14(a) conceptually shows an initial state of the experiment sample "B", and FIG. 14(b) conceptually shows a state of the experiment sample "B" after being left in a high temperature environment for a long time. Further, FIG. 15 is a microscope photograph showing the experiment sample "B" after being left in a high temperature environment for a long time.

As shown in FIG. 14(a), in the experiment sample "B", a diffusion prevention layer 91 is formed of nickel (Ni) on an electrode 90 formed of copper (Cu), and further, a diffusion prevention layer 92 formed of an intermetallic compound of nickel-tin (Ni—Sn) on the diffusion prevention layer 91. Two such electrodes are prepared, and two diffusion prevention layers 92 are joined to face each other by a solder layer 100.

Although the experiment sample "B" is left in a high temperature environment for a long time, as shown in FIG. 14(b), nickel forming the diffusion prevention layer 91 or nickel contained in the diffusion prevention layer 92 does not diffuse into the solder layer 100.

Figure 15:
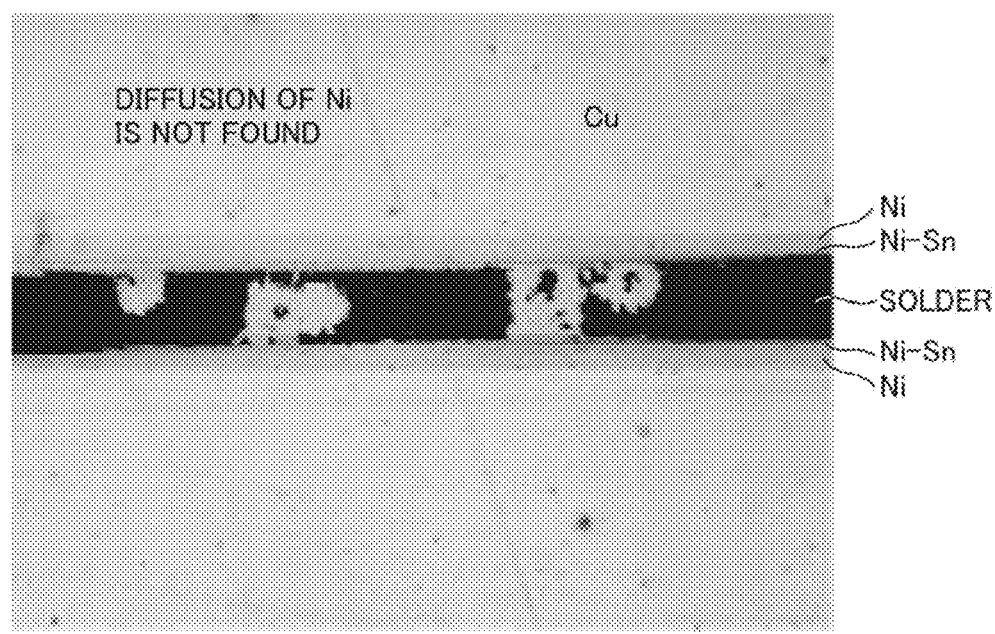
FIG. 15 is a micros cope photograph showing the experiment sample "B" after being left in a high temperature environment a long time.

FIG. 15 shows the experiment sample "B" after being left at a temperature of 280° C. for 1000 hours. The composition of solder used here is 98% Pb-2% Sn. As shown in FIG. 15, it is found that a layer of nickel (Ni) and a layer of nickel-tin (Ni—Sn) are preserved. As a result, the solder layer does not come in direct contact with the electrode, and copper (Cu) in the electrode does not diffuse into the solder layer.

Figure 16:
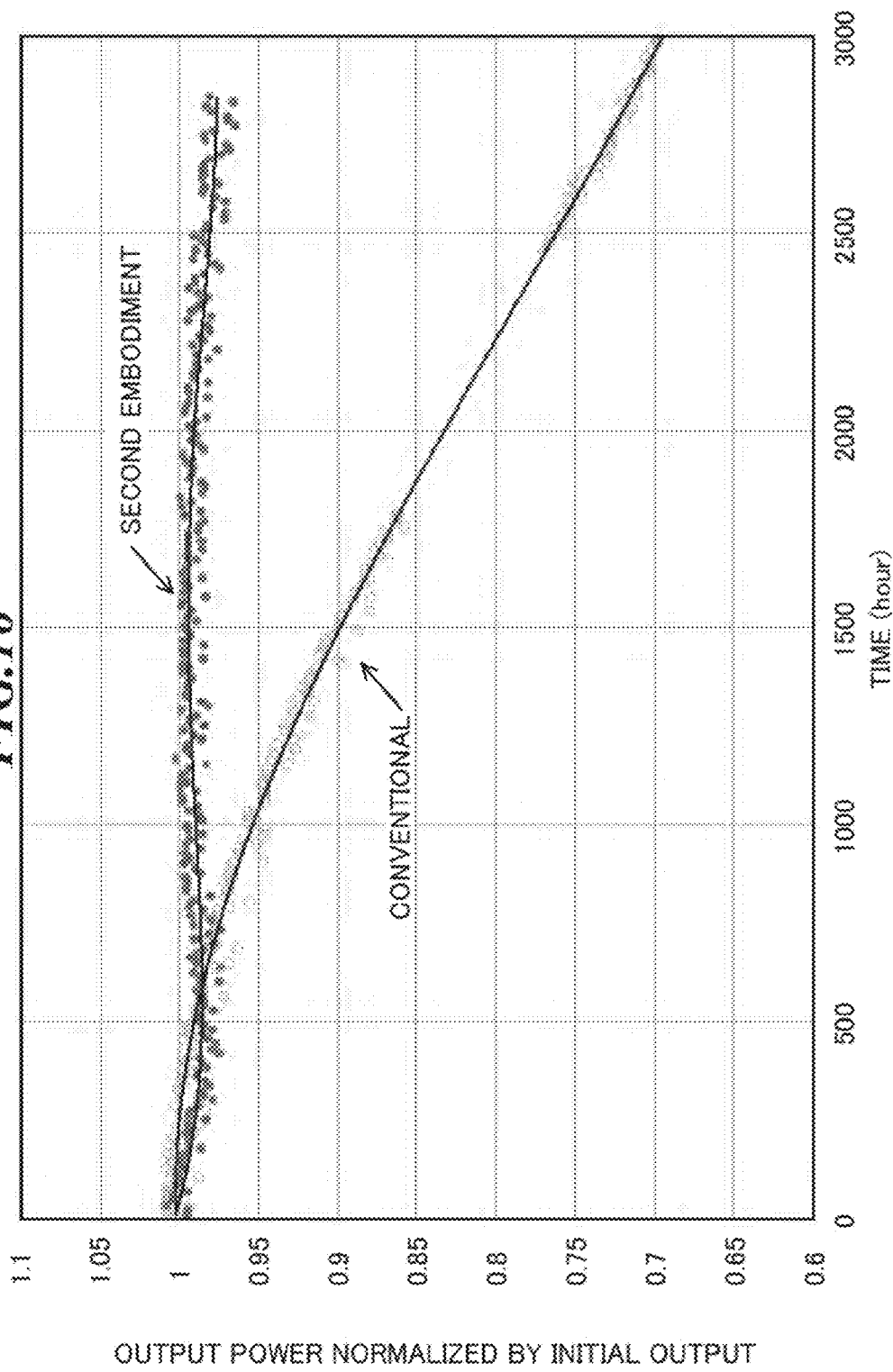
FIG. 16 is a diagram for comparison of a change of output power of the thermoelectric power module according to the second embodiment of the present invention with that of the thermoelectric power module according to the comparative example.

FIG. 16 is a diagram for comparison of a change of output power of the thermoelectric power module according to the second embodiment of the present invention with that of the thermoelectric power module according to the comparative example. In FIG. 16, the horizontal axis represents time (hour) for which the thermoelectric module is used, and the vertical axis represents output power normalized by the initial output. The composition of solder used here is 98% Pb-2% Sn. Further, a temperature (Th) of the higher temperature portion is 280° C., and a temperature (Tc) of the lower temperature portion is 30° C. at that time.

As shown in FIG. 16, the output power of the thermoelectric power module according to the comparative example reduces by 10% at about 1500 hours from start of use, while the output power of the thermoelectric power module according to the second embodiment of the present invention is stable for a long term although it slightly changes.

INDUSTRIAL APPLICABILITY

The present invention can be applied to a thermoelectric power module using thermoelectric elements and thereby generating electricity by utilizing difference in temperature.

The invention claimed is:
1. A thermoelectric power module comprising:
a thermoelectric power element;
a first diffusion prevention layer consisting essentially of molybdenum (Mo) and disposed on a surface of said thermoelectric power element;
a second diffusion prevention layer consisting essentially of an intermetallic compound of nickel-tin Ni—Sn selected from the group consisting of $Ni_3Sn$ having enthalpy of formation of −24.9 kJ/mol $Ni_3Sn$ having enthalpy of formation of −34.6 kJ/mol and $Ni_3Sn_4$ having enthalpy of formation of −24.0 kJ/mol when the intermetallic compound is produced from nickel, said second diffusion prevention layer being disposed on a surface of said first diffusion prevention layer opposite to said thermoelectric power element side;
an electrode formed of copper (Cu);
a third diffusion prevention layer consisting essentially of the intermetallic compound of nickel-tin (Ni—Sn) and disposed on a surface of said electrode so as to surround said electrode; and
a solder layer containing lead (Pb) at not less than 85% and configured to join said second diffusion prevention layer and said third diffusion prevention layer to each other.

2. The thermoelectric power module according to claim 1, further comprising:
a first solder joint layer consisting essentially of tin (Sn) and disposed on a surface of said second diffusion prevention layer and in direct contact with said solder layer; and
a second solder joint layer consisting essentially of tin (Sn) and disposed on a surface of said third diffusion prevention layer and in direct contact with said solder layer.

3. A thermoelectric power module comprising:
a thermoelectric power element;
a first diffusion prevention layer consisting essentially of molybdenum (Mo) and disposed on a surface of said thermoelectric power element;
a second diffusion prevention layer consisting essentially of nickel (Ni) and disposed on a surface of said first diffusion prevention layer opposite to said thermoelectric power element side;
a third diffusion prevention layer consisting essentially of an intermetallic compound of nickel-tin Ni—Sn selected from the group consisting of $Ni_3Sn$ having enthalpy of formation of −24.9 kJ mol Ni Sn having enthalpy of formation of −34.6 kJ mol and $Ni_3Sn_4$ having enthalpy of formation of −24.0 kJ/mol when the intermetallic compound is produced from nickel, said third diffusion prevention layer being disposed on a surface of said second diffusion prevention layer opposite to said first diffusion prevention layer side;
an electrode formed of copper (Cu);
a fourth diffusion prevention layer consisting essentially of nickel (Ni) and disposed on a surface of said electrode so as to surround said electrode;
a fifth diffusion prevention layer consisting essentially of the intermetallic compound of nickel-tin (Ni—Sn) and disposed on a surface of said fourth diffusion prevention layer opposite to said electrode side so as to surround said electrode; and
a solder layer containing lead (Pb) at not less than 85% and configured to loin said third diffusion prevention layer and said fifth diffusion prevention layer to each other.

4. The thermoelectric power module according to claim 3, further comprising:
a first solder joint layer consisting essentially of tin (Sn) and disposed on a surface of said third diffusion prevention layer and in direct contact with said solder layer; and
a second solder joint layer consisting essentially of tin (Sn) and disposed on a surface of said fifth diffusion prevention layer and in direct contact with said solder layer.

* * * * *